United States Patent [19]
Wan et al.

[11] Patent Number: 6,087,190
[45] Date of Patent: Jul. 11, 2000

[54] AUTOMATIC TEST PROCESS WITH NON-VOLATILE RESULT TABLE STORE

[75] Inventors: Ray-Lin Wan, Fremont, Calif.; Chun-Hsiung Hung, Hsinchu; Tzeng-Huei Shiau, Hsin-Chi, both of Taiwan

[73] Assignee: Macronix International Co., Ltd., Hsinchu, Taiwan

[21] Appl. No.: 08/973,582

[22] PCT Filed: Oct. 8, 1997

[86] PCT No.: PCT/US97/18204

§ 371 Date: Nov. 17, 1997

§ 102(e) Date: Nov. 17, 1997

[87] PCT Pub. No.: WO99/18531

PCT Pub. Date: Apr. 15, 1999

[51] Int. Cl.$^7$ .......................... H10L 21/00; H10L 21/66; G01R 31/26
[52] U.S. Cl. .................................. 438/11; 438/18
[58] Field of Search .................... 438/10, 11, 17, 438/18

[56] References Cited

U.S. PATENT DOCUMENTS 3,659,088  4/1972  Boisvert, Jr. ............................ 371/21.6
5,627,838  5/1997  Lin et al. ................................. 371/21.1

*Primary Examiner*—Brian Dutton
*Attorney, Agent, or Firm*—Mark A. Haynes; Haynes & Beffel

[57] ABSTRACT

A method of manufacturing integrated circuits based on providing a test column of memory cells in the devices. Cells in the test column are selected by a portion of the addresses which identifies a row in the main array on the device. A test is executed to determine a characteristic of the device, and the results of that test are mapped to the portion of the address which identifies a row in the array. This produces a characteristic code address for the device which indicates the results of the test. Access to the test column on the device is enabled, and a bit is written in response to the characteristic code address in a memory cell on the test column. During manufacture the test column is read in order to classify the device according to the characteristic. This allows for storing in a table look-up format, significant amounts of data about the characteristics of the device without requiring large amounts of memory on the device, and substantially relieving the testing system of a requirement for memory resources.

20 Claims, 7 Drawing Sheets

AUTOMATIC TEST PROCESS WITH NON-VOLATILE RESULT TABLE STORE

BACKGROUND OF THE INVENTION

1. Field of the Invention

The present invention relates to the manufacture and testing of integrated circuits; and more particularly to circuits to test integrated circuits such as EEPROMs or FLASH memory for production purposes.

2. Description of Related Art

In the manufacture of integrated circuits, testing for both engineering and production purposes is critical. Thus, most integrated circuits incorporate test circuitry on the chip to facilitate the testing processes. The ability to test a large number of devices at one time is particularly important for production purposes, where the testing step is incorporated into the method for manufacturing the integrated circuit. In production testing systems for "gangs" of integrated circuits, the amount of data which must be monitored by a processor controlling the testing can be quite large. This slows down the testing processes, and limits the amount of information which can be processed during the testing mode.

Testing is of significant importance in the non-volatile memory device field. For instance, the memory devices must be tested for endurance, and qualified according to read and write speed and threshold margin specifications during manufacturing. Also, the endurance, read and write speed and threshold parameters of the circuit are important for engineering purposes during the design of a product.

One popular class of non-volatile memory cell is based on a floating gate transistor which consists of a source, channel, and drain with a floating gate over the channel and a control gate isolated from the floating gate. The act of programming the cell involves charging the floating gate with electrons which causes the turn-on threshold of the memory cell to increase. Thus, when programmed the cell will not turn on, that is it will remain non-conductive, when addressed with a read potential applied to its control gate. The act of erasing the cell involves removing electrons from the floating gate to lower the threshold. With the lower threshold, the cell will turn on to a conductive state when addressed with a read potential to the control gate.

Further, commercial designs include circuitry for verifying the success of programming and erasing steps. See, for instance, U.S. Pat. No. 4,875,118, entitled VOLTAGE MARGINING CIRCUIT FOR FLASH EPROM, invented by Jungroth.

Also, commercial devices incorporate automatic program and erase modes which can be used for testing the operation of the non-volatile design.

In order to meet specific quality requirements for floating gate memory devices like FLASH EPROMs and EEPROMs, program and erase cycling is required to screen out devices which have low endurance (i.e., suffer "infant mortality"). To simplify the hardware requirements for the testing and reduce the cycle time, gang cycling is required in the production environment. Thus, it would be desirable to provide an automatic program and erase mode with some intelligence to facilitate gang cycling. For engineering, it is also important to have a mode that will record the status of the device during cycling to indicate the endurance of the specific device.

Also during the manufacturing of the integrated circuits, the devices are characterized according to their performance characteristics such as voltage margins, endurance, speed of operation, and the like. Information about the group of integrated circuits being tested is processed by a testing machine in order to bin-out the devices having varying specifications. Thus, high speed devices can be sold at a higher price than low speed devices. Devices with greater voltage margins can be sold at higher prices than lower margin devices. Other results of testing, such as the detection of bad segments in the memory, and the like can be also used to bin-out devices.

Thus, during the testing a large amount of data is accumulated about the integrated circuits under test. As the number of circuits under test gets large in a given system, and the speed of testing is increased, all this information begins to burden the memory resources of the testing system. See, for example U.S. Pat. Nos. 4,419,747 and 4,451,903.

Thus, it is desirable to provide a system which can relieve the testing system of much of the memory resource requirement. This allows for more accurate, more reliable, and faster processing of large numbers of integrated circuits during their manufacture.

SUMMARY OF THE INVENTION

The present invention provides a method of manufacturing integrated circuits based on providing a test column of memory cells in the devices. Cells in the test column are selected by a portion of the addresses which identifies a row in the main array on the device or such as by selecting a wordline in the main array. A test is executed to determine a characteristic of the device, and the results of that test are mapped to the portion of the address which identifies a row in the array. This produces a characteristic code address for the device which indicates the results of the test. Access to the test column on the device is enabled, and a bit is written in response to the characteristic code address in a memory cell on the test column. During manufacture the test column is read in order to classify the device according to the characteristic. This allows for storing in a table look-up format significant amount of data about the characteristics of the device without requiring large amounts of memory on the device, and substantially relieving the testing system of a requirement for memory resources.

During the manufacturing of the device, the test system stores a look-up table which maps the results of tests to row addresses. As the devices in the gang of devices is tested, the bits in the test column are written based on the look-up table coding. After the testing is completed, and the devices subject of the test process need to be classified according to the characteristics measured by the test, the test column is read from the device, and a decision is made based on the bits set in the test column.

According to one aspect of the invention, a suite of tests is executed. The test column is divided into a plurality of sets of cells which correspond it to tests in the suite of tests. Thus, a first set corresponds to a first test in the suite, and a second set of cells in the test column corresponds to a second test in the suite. The suite of tests is executed for the devices in the gang of integrated circuits being tested. Data specifying the results of the suite of tests is produced. The results of the respective tests are mapped to the corresponding sets of cells in the test column. Thus the results of the first test in the suite of tests are mapped to the portion of addresses which identifies a row in the array in the first set of cells. The results of the second test in the suite of tests are mapped to the portion of the addresses which identifies a row in the array in the second set. Thus a predefined suite of tests is mapped to a predefined set of locations in the test column. By reading the test column, each bit in the test column corresponds to the results of the test in the suite of tests. Thus a single bit is able to indicate a substantial amount of data to the testing system.

According to another aspect of the invention, it is adapted for the manufacturing of flash memory devices that are based on an array of floating gate memory cells. The test column is implemented as one extra column in the array of floating gate cells, such that the wordlines of the array are used for accessing rows in the test column, and an extra bitline is provided which can be enabled independent of the bitlines in the array for storing data during the testing processes. For example, on an integrated circuit that includes address inputs receiving addresses for accessing the array, the test column is enabled by applying a high voltage to an address input on the device other than the address inputs used for the portion of addresses which identify a row of cells. In response to the high voltage, the extra bitline is connected to write circuitry for memory cells in the test column, or to read circuitry for reading data in the memory cells in the test column. In an alternative mode, mode control logic is responsive to command codes on the data inputs to enable read or write to the test column.

Accordingly, the present invention provides an automatic test mode for production purposes that involves the use of non-volatile status write circuitry on integrated non-volatile memory devices. The technique is expandable to a wide variety of integrated circuits, and facilitates the testing of large numbers of such circuits with greater speed, and with greater amounts of status information generated by the test.

Other aspects and advantages of the present invention can be seen upon review of the figures, the detailed description, and the claims which follow.

DETAILED DESCRIPTION

Figure 1:
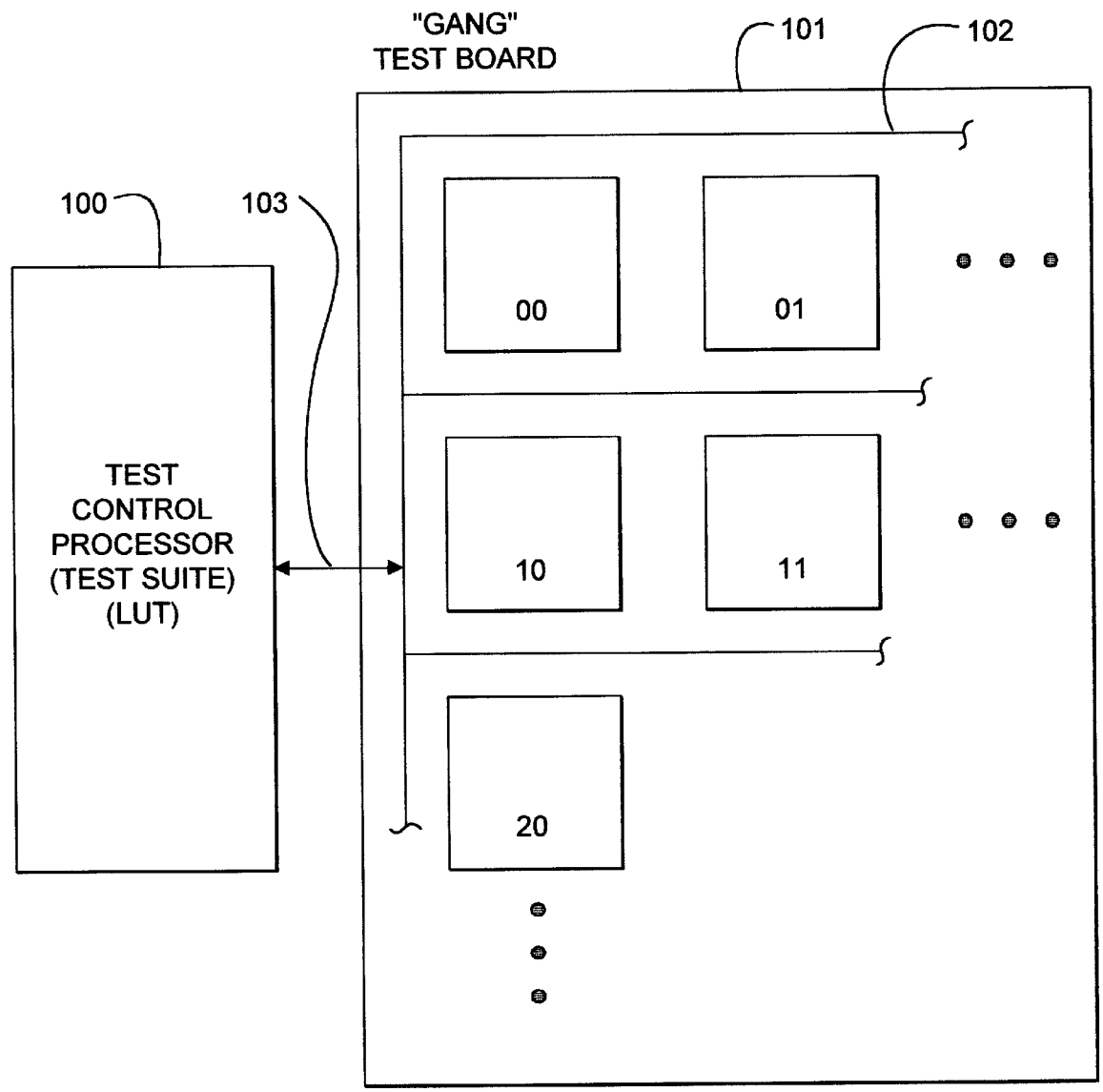
FIG. 1 is a schematic diagram of a testing apparatus used in the production if integrated circuits according to the present invention.
Figure 2:
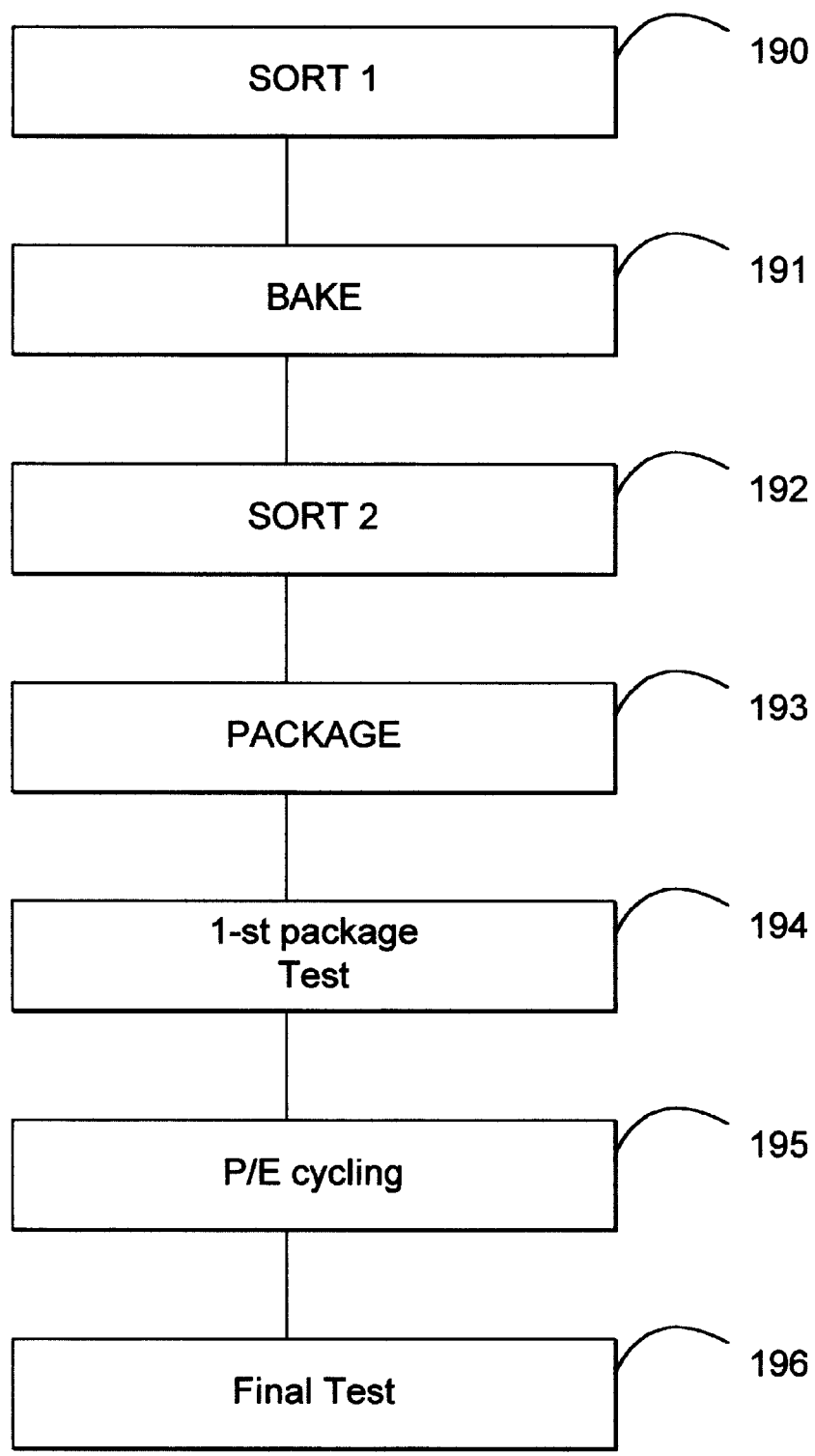
FIG. 2 is a test flow for a non-volatile memory device incorporating the present invention.

A detailed description of preferred embodiments of the present invention is provided with respect to FIGS. 1–8. FIGS. 1–2 illustrates the basic environment of integrated circuit manufacturing using non-volatile result write circuitry according to the present invention. FIGS. 3–8 describe an implementation of a FLASH memory integrated circuit, and a method for testing the same for production and engineering purposes according to the present invention.

FIG. 1 heuristically illustrates a mechanism used during manufacture of an integrated circuit according to the present invention. This mechanism includes a test control processor 100 and a test board 101 for gang testing of integrated circuits. The integrated circuits are arranged on the board 101 in an array including circuit 00, circuit 01, circuit 10, circuit 11, circuit 20, and other circuits arranged on the device in rows and columns. The board 101 includes a test bus 102 which is coupled to the integrated circuits in the array on the board 101. The test control processor communicates with the bus 102 across line 103. The test control processor 100 includes resources for executing a suite of tests on the gang of devices. Also, a look-up table LUT is included for mapping the results of tests in the suite of tests to corresponding bits or sets of bits in a test column.

Figure 3:
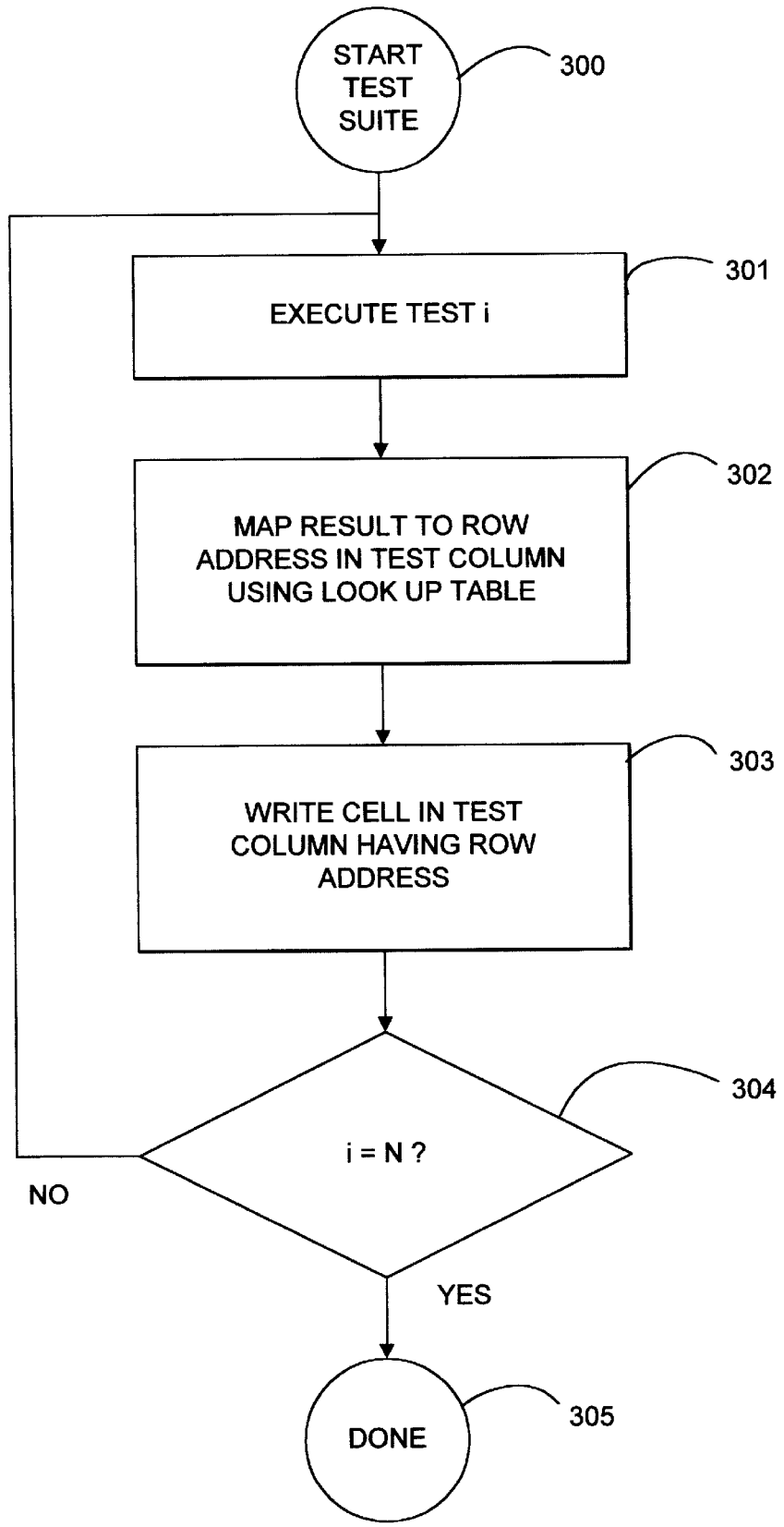
FIG. 3 illustrates a process for executing a suite of tests according to the present invention.

Using an integrated circuit implemented as shown in FIG. 3, the test control processor controls the integrated circuits to execute tests in parallel, with the results of the tests being stored in non-volatile memory on each integrated circuit. Later, the data stored in the non-volatile result stores on the chips can be scanned out for analysis by the test control processor. This process eliminates the need to test and receive the status information generated by the test for each circuit in series. Furthermore, the non-volatile result store in each integrated circuit may store significantly more data, indicating a variety of aspects of the test results which is unavailable in prior art systems due to the speed requirements of gang testing of integrated circuits.

FIG. 2 illustrates the test flow for production of an integrated circuit incorporating the non-volatile result write circuitry according to the present invention. The test production method involves a first sorting step SORT1, as indicated at block 190, at the wafer level to pick good die within the wafer which pass program and erase operation tests and to program a 00 (hex) pattern data in the cells in the device.

The next step involves baking the device, as indicated at block 191. The baking of the device will cause programmed devices with weak retention capabilities to fail. In the SORT2 step (block 192), the devices are selected on the wafer which passed the retention test. After SORT2, the individual die are packaged (block 193). After packaging, a first package test is executed (block 194) to do a functional test of the chip to ensure that the device can be programmed and erased and that the array can be read according to the specified timing. After package tests, the APE (automatic program and erase) endurance cycling is executed (block 195). This cycling tests the endurance of the integrated circuits, and may be programmed as described above for engineering purposes or for production purposes. After APE cycling in block 195, a final test is executed in block 196. During the final test, the test column is read using the timing diagram of FIG. 6, to screen out devices that fail cycling tests. Then a checkerboard pattern is programmed to test the speed grade of the individual devices. At each step of FIG. 2, results of the tests can be stored in a table look-up fashion in a test column as described below.

FIG. 3 is a flow chart illustrating the basic process of executing a suite of tests on an integrated circuit, such as at point 194 in FIG. 2. Thus the process begins by starting the test suite on a selected integrated circuit in the gang of integrated circuits at point 300. The process enters a loop for executing a suite of tests over the index i, starting with executing the first test in the index (step 301). Results of the test i are mapped to a row address in the test column using a look-up table in the testing system (step 302). After mapping the result to a row address, a cell in the test column having that row address is written to a predetermined state, such as a low threshold state, or alternatively a high threshold state (step 303). Next, the algorithm determines whether all tests have been executed by reading the index i (step 304). If i=N (the number of tests in the suite), then the algorithm is done (step 305). If the last test has not been executed in the suite, then the algorithm loops to step 301 to execute the next test. Following this loop, each integrated circuit in the gang of integrated circuits is written with the results of the suite of tests being executed on the device. After all the circuits have been tested, each can be read by the testing system during the sorting of the chips, in order to classify the chips according to the characteristics indicated by the results of these tests. For example, in one preferred embodiment, there are 1K wordlines in an array of floating gate cells. The test column includes a column of cells which share the 1K wordlines. For example, address bits A14–A7 in a 17 or 19 bit address space (A0–A16 or A0–A18) are utilized to identify a row in the array by selecting a wordline. Address bit A6 is used to receive the high voltage to enable access to the test column. In one preferred embodiment, the single extra bitline used for the test column is coupled to two columns of cells (See FIG. 5 below). In this embodiment, address bit A0 is used to select the left hand column or the right hand column of cells on the extra bitline. In this embodiment, the left hand column is utilized for the automatic program and erase cycling process described U.S. Pat. No. 5,627,185 entitled AUTOMATIC TEST CIRCUITRY WITH NON-VOLATILE STATUS WRITE, which is incorporated by reference as if fully set forth herein. The right hand column is used according to the present invention for mapping the results of tests using a table look-up technique to a column of cells in the array. In alternative systems both columns can be utilized for the mapping of test results onto single bits in the array as described in the present application.

In one example embodiment, the test column of the present invention is mapped to a number of tests, including a test for determining whether the die is a good die or a bad die (e.g. step 192 of FIG. 2). Another test indicates whether the part should be interpreted as a bin 1 part, or a bin 2 part, such as parts which can be configured for use of the entire array built on the chip, or parts which can be configured for only half of the array, or otherwise. Thus, address bit A16 can be used to indicate whether a given part is a bin 1 part or a bin 2 part in the table. The address bits A14–A7 can be utilized to indicate the margin of the parts. For example, bin 1 part with a margin of 7.2 volts would have the bit set at addresses A16–A7 equal to 1, 0, 1, 1, 1, 0, 0, 1, 0. Margin value 7.2 is defined by address bits A11–A14 for the most significant bit numeral, and addresses A7–A10 for the less significant numeral. Similarly, a bit set at row address 0, 0, 0, 1, 1, 0, 0, 1, 1, 0 can be interpreted as a bin 2 part with a margin of 6.6 volts where the most significant numeral is defined by address bits A11–A14, and the less significant numeral is defined by address bits A7–A10.

A wide variety of test results can be reflected by setting up a look-up table in advance which corresponds to acceptable ranges of test results for the parts under test.

Figure 4:
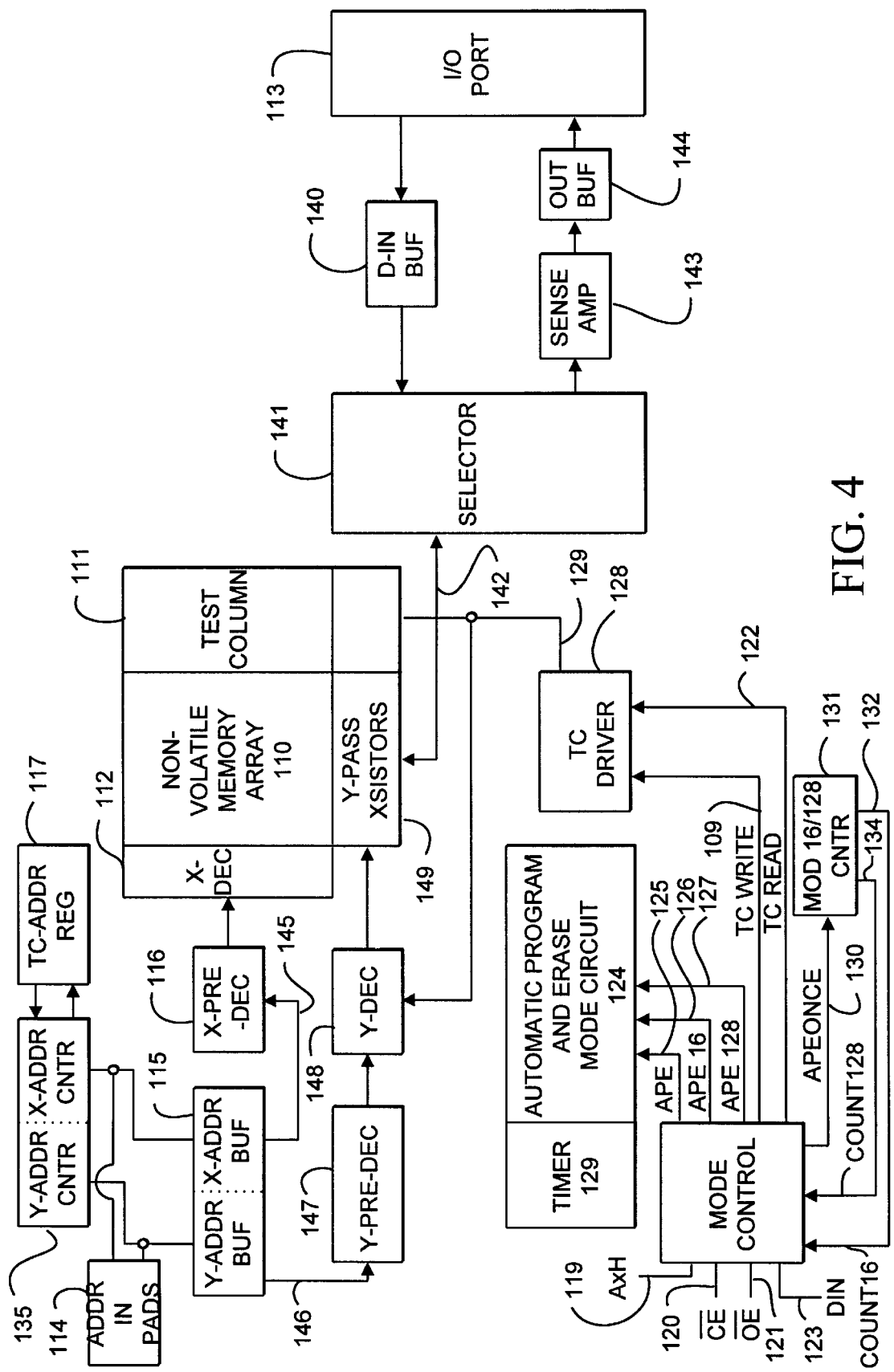
FIG. 4 is a functional block diagram of a non-volatile memory integrated circuit incorporating the non-volatile result write circuitry according to the present invention.
Figure 5:
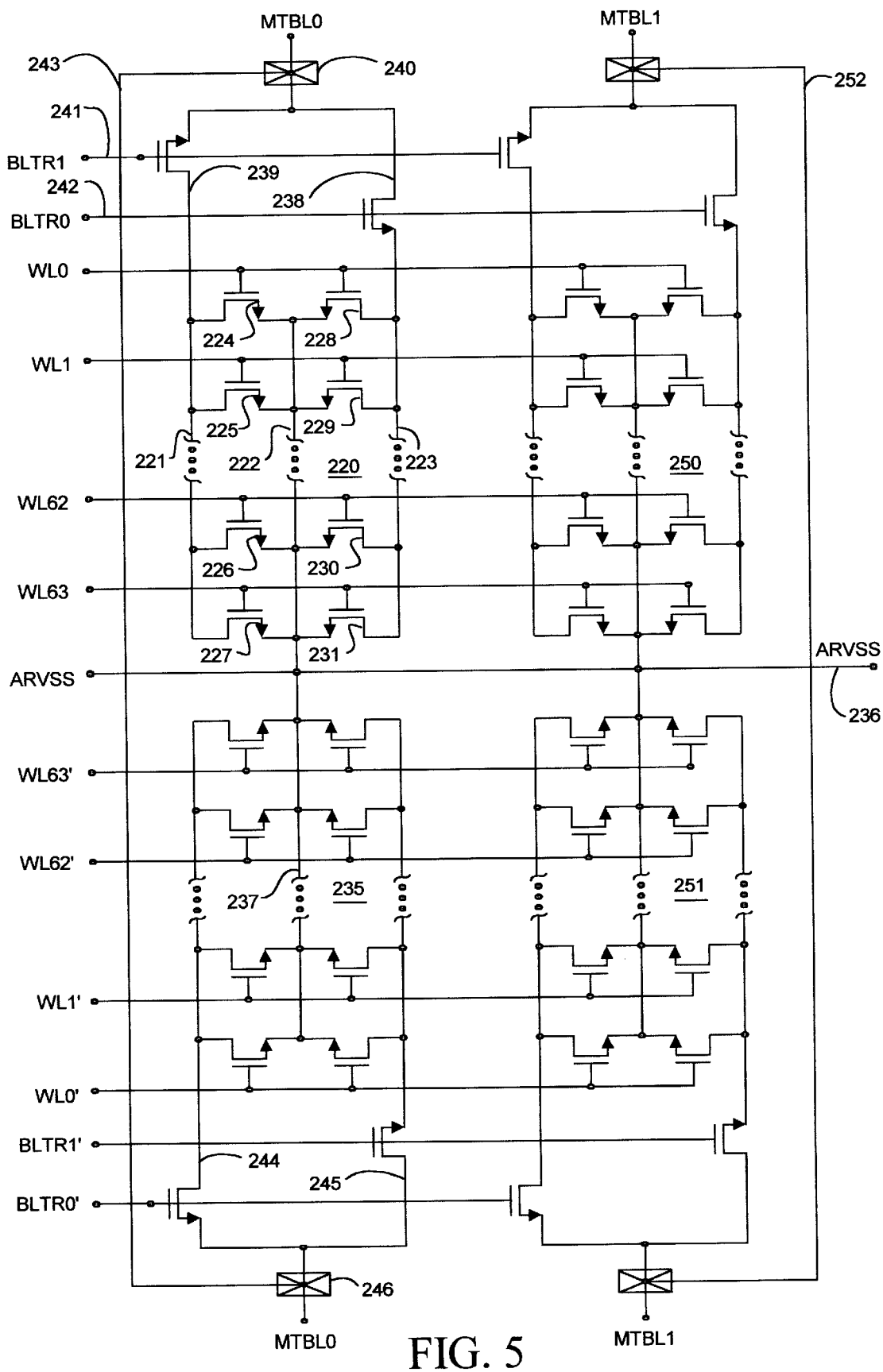
FIG. 5 is a schematic diagram of a segmentable architecture FLASH array according to the present invention.

FIGS. 4 and 5 illustrate the architecture of an integrated circuit according to the present invention which supports the processes of FIGS. 2 and 3 above.

FIG. 4 is a functional block diagram of a non-volatile memory device implemented according to the present invention.

The device includes a non-volatile memory array 110. The array includes a plurality of rows and columns (not shown). At least one of the columns is referred to as a test column 111 which can be selected during test modes, for non-volatile result write during test modes and for read out of status information during a test column read mode. An X-decoder 112 is coupled to the array 110 and drives wordlines along the rows of the array. An I/O port schematically shown at 113, provides access to data in the array, including the data in the test column 111. The I/O port 113 is coupled through data-in buffer 140 and selector 141 to data line 142 of the array 110, and to data line 142 through selector 141, sense amps 143 and data-out buffer 144. The array is addressed through address input pads 114 which are coupled to an address buffer 115. The outputs of the address buffer 115 include an X-address on line 145 supplied to an X pre-decoder 116 which drives the X-decoder 112 using techniques known in the art. The address buffer 115 supplies a Y-address on line 146, to Y pre-decoder 147, and Y-decoder 148 to column select Y-pass transistors 149 in the array 110.

The non-volatile memory array also includes mode control logic 118 which is coupled to receive the address high voltage signals AxH on line 119 as input (if needed), a chip enable signal on line 120, an output enable signal on line 121, and data in signals on line 123. In alternative systems, the AxH signal on line 119 is not needed. In these alternative systems, the mode control logic is responsive to command codes on the data inputs to determine the test column read and write modes. Mode control logic is used to control the mode of operation of the integrated circuit. According to the preferred embodiment, the user modes include at least a program mode, an erase mode, and a read mode. Test modes include three automatic program and erase (APE) test modes, a test column read mode, a test column write mode and others.

Coupled with the mode control logic 118 is an automatic program and erase circuit 124, which includes all the circuit necessary for programming and erasing the cells in the non-volatile memory array. See U.S. Pat. Nos. 5,539,688 and 5,414,664.

According to a preferred implementation, the mode control logic 118 includes three different test APE modes, including a free-running APE mode as signaled on line 125, an APE mode which executes 16 APE cycles, as indicated on line 126, and an APE mode which executes 128 APE cycles, as indicated on line 127. Also, a test column read mode is signaled on line 122. During assertion of the signals on lines 125, 126, or 127 an APE test column enable signal TC WRITE is supplied on line 109 to a test column driver 128 during test column programming which provides data on line 129 to the test column 111 and disables the Y-decoder 148 to cause programming of the test column 111 in response to X-address identified in TC register 117. Also, a timer 129 is coupled to the APE mode circuits 124.

An APEONCE signal on line 130 is generated by the mode control logic 118 during the APE cycling. This signal is used to increment a mod16/128 counter 131. The mod16/128 counter 131 generates a count 16 signal on line 132 and a count 128 signal on line 134 which are sent to the mode control logic 118.

A TC register 117 is coupled to the address counter 135 for supplying wordline address bits during APE cycling to identify the proper location in the test column 111 for status write for every 16 program erase cycles. The value in the TC register 117 is dumped into address counter 135 during the APE processing, and through the address counter 135 to the address buffer 115. This value is initialized at zero and used for addressing the particular memory cell in the test column 111 for a particular exercise of the program and erase circuitry. On each access, the address counter 135 increments by one, and returns the incremented value to the TC register 117. Thus, for each 16 cycle exercise, a new row in the non-volatile memory array test column 111 is addressed for writing the status information. In the result write mode, the address of the bit corresponding to the test result is supplied on the address input pads 114, for example.

FIG. 5 illustrates an architecture of the flash array according to the present invention, in which two columns of flash cells share a single metal bit line. FIG. 5 shows four pairs of columns of the array, where each pair of columns includes flash cells in a drain-source-drain configuration.

Thus, the first pair 220 of columns includes a first drain diffusion line 221, a source diffusion line 222, and a second drain diffusion line 223. Wordlines WL0 through WL63 each overlay the floating gates of a cell in a first one of the pairs of columns and a cell in the second one of the pairs of columns. As shown in the figure, a first pair 220 of columns includes one column including cell 224, cell 225, cell 226, and cell 227. Not shown are cells coupled to wordlines WL2 through WL61. The second one of the pair 220 of columns includes cell 228, cell 229, cell 230, and cell 231. Along the same column of the array, a second pair 235 of columns is shown. It has a similar architecture to the pair 220 of columns except that it is laid out in a mirror image.

Thus, as can be seen, the transistor in the first one of the pair of columns, such as the cell 225, includes a drain in drain diffusion line 221, and a source in the source diffusion line 222. A floating gate overlays the channel region between the first drain diffusion line 221 and the source diffusion line 222. The wordline WL1 overlays the floating gate of the call 225 to establish a flash EPROM cell.

The column pair 220 and column pair 235 share an array virtual ground diffusion 236 (ARVSS). Thus, the source diffusion line 222 of column pair 220 is coupled to the ground diffusion 236. Similarly, the source diffusion line 237 of column pair 235 is coupled to the ground diffusion 236.

As mentioned above, each pair 220 of columns of cells, including the extra test column, shares a single metal line. Thus, a block right select transistor 238 and a block left select transistor 239 are included. The transistor 239 includes a drain in the drain diffusion line 221, a source coupled to a metal contact 240, and a gate coupled to the control signal BLTR1 on line 241. Similarly, the right select transistor 238 includes a source in the drain diffusion line 223, a drain coupled to the metal contact 240, and a gate coupled to the control signal BLTR0 on line 242. Thus, the select circuitry, including transistors 238 and 239, provides for selective connection of the first drain diffusion line 221 and a second drain diffusion line 223 to the metal line 243 (MTBL0) through metal contact 240. As can be seen, column pair 235 includes left select transistor 244 and right select transistor 245 which are similarly connected to a metal contact 246. Contact 246 is coupled to the same metal line 243 as is contact 240 which is coupled to column pair 220. The metal line can be shared by more than two columns of cells with additional select circuitry.

The architecture shown in FIG. 5 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash cells comprising M wordlines and 2N columns. The array requires only N metal bitlines each of which is coupled to a pair of columns of flash cells through select circuitry, as described above.

Although the figure only shows four column pairs 220, 235, 250, and 251, coupled to two metal bitlines 243 and 252 (MTBL0–MTBL1), the array may be repeated horizontally and vertically as required to establish a large scale flash memory array. Thus, column pairs 220 and 250 which share a wordline are repeated horizontally to provide a segment of the array. Segments are repeated vertically. A group of segments (e.g., eight segments) having respective wordlines coupled to a shared wordline driver may be considered a sector of the array.

Figure 6:
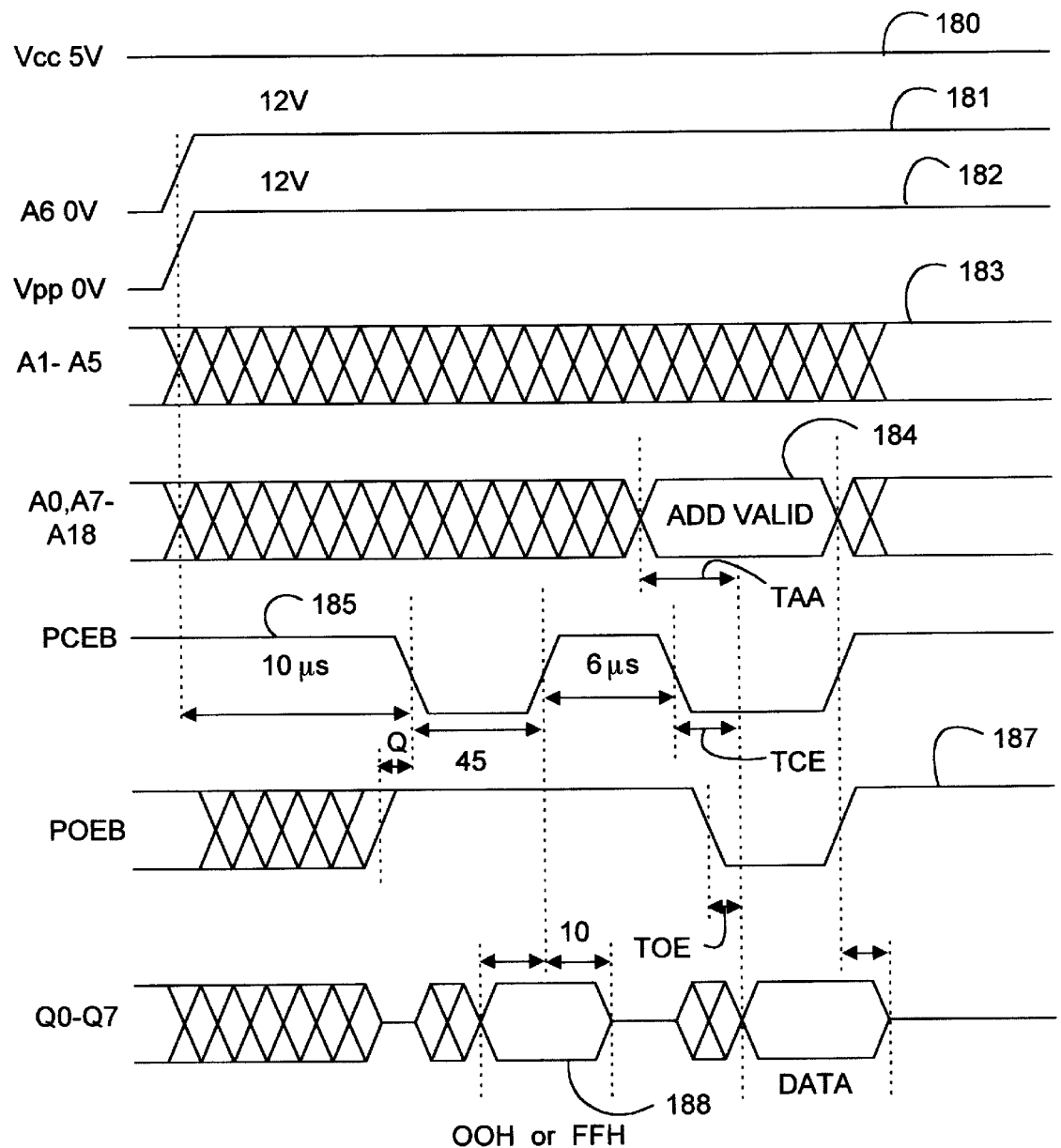
FIG. 6 is a timing diagram illustrating the test column read sequence for the integrated circuit according to one alternative approach.

The test column read timing waveform as shown in FIG. 6 is used to read the test column, according to one alternative approach. The test column read timing waveform is entered after the $V_{CC}$ voltage supply is high as indicated at 180. The address signal A6 and the $V_{PP}$ programming potential are asserted to the 12 volt programming potential, as indicated at lines 181 and 182, respectively. Address signals A1–A5 are in a don't care state, as indicated at line 183. Address A0 selects left or right cell in the test column. Address signals A0 and A7–A18 are asserted during the window indicated at 184 to address a particular cell in the test column. This accessing is accomplished by manipulating the chip enable signal on line 185 and the output enable signal on line 187. Thus, when the chip enable signal goes low, data on lines Q0–Q7 is asserted as shown at line 188 with either all zeroes or all ones to enter the read mode with the test column selected by high A6. In order to read the data from the test column, the output enable signal is asserted, as indicated at line 187. The data from the test column is read out, as indicated at line 188, after a valid address is supplied on line 184.

Figure 7:
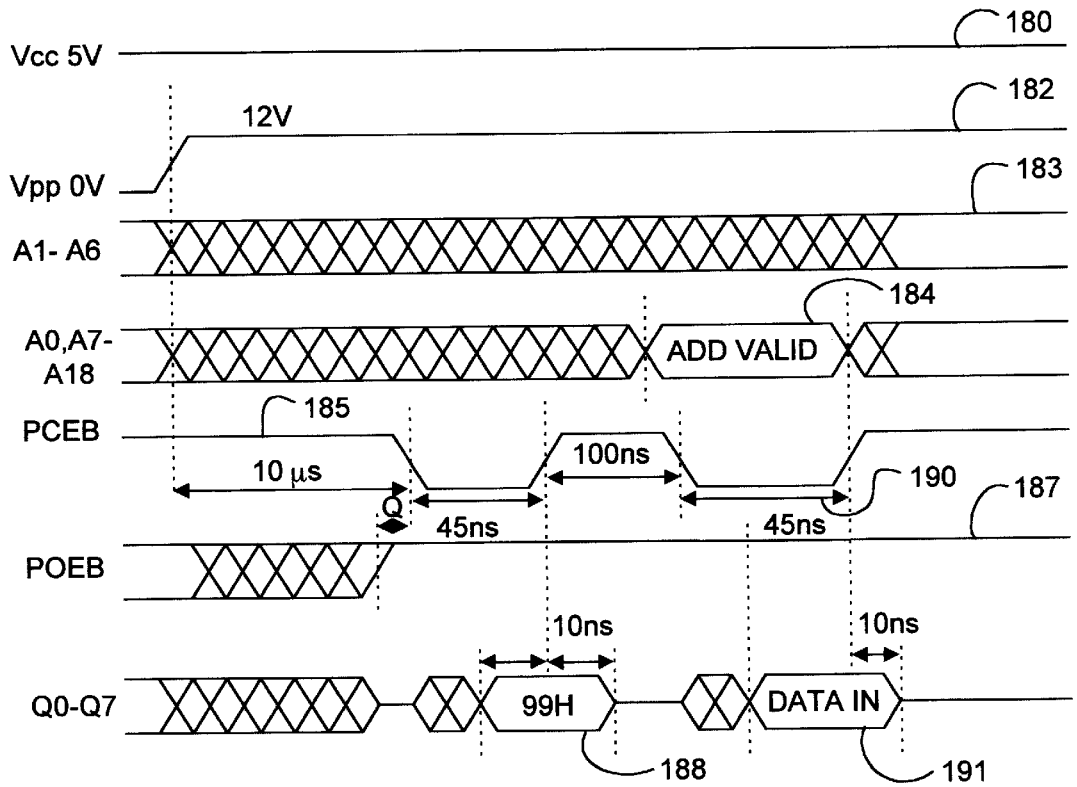
FIG. 7 is a timing diagram illustrating the test column write sequence for the integrated circuit according to another alternative approach.
Figure 8:
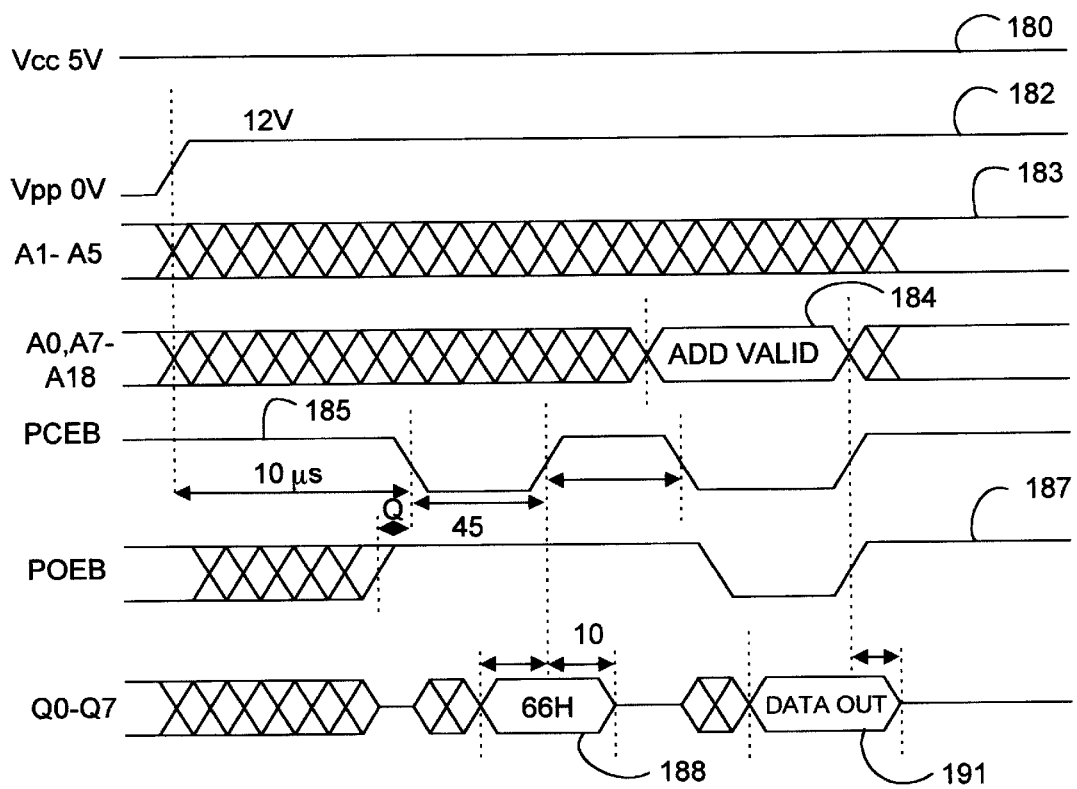
FIG. 8 is a timing diagram illustrating the test column read sequence for the integrated circuit according to an approach like that of FIG. 7.

FIGS. 7 and 8 illustrate the timing waveforms for an alternative approach to enabling the test column write and read modes respectively. According to the techniques of FIGS. 7 and 8, there is no need for a high voltage to be applied to an address pin, such as the address signal A6 discussed with respect to FIG. 6. Rather, command codes on the data lines are utilized by the mode control logic to identify the modes of operation. In FIGS. 7 and 8, the signal lines are given the same references as used in FIG. 6 where appropriate. Note that there is no separate trace for address bit A6 in FIGS. 7 and 8.

The process for test column write is illustrated in FIG. 7. In this operation, as illustrated in the timing waveform, the supply voltage $V_{CC}$ is high at 5 volts as indicated at line 180. The $V_{PP}$ programming potential is asserted to the 12 volt programming potential as indicated at line 182. Address signals A1–A6 are in a don't care state as indicated at line 183. Address signal A0 indicates left or right cell in the test column. Address signals A0 and A7–A18 are asserted during the window indicated at 184 to address a particular cell in the test column. This accessing is signalled by manipulating the chip enable signal on line 185 and the output enable on line 187. Thus when the chip enable signal goes low, data on lines Q0–Q7 includes a command code, for example 99 hex, which is distinguishable from other command codes used by the mode control logic to indicate the test column write mode. In order to write data to the test column, after raising the active low chip enable signal high for 100 nanoseconds, it is asserted low again as indicated at 190 for about 45 nanoseconds. The input data is then asserted as indicated at 191. In this mode, if there is only one test column, then only one data line, for example Q7, is required. In alternative modes, where there are more than one column, then as many as eight of the data lines Q0–Q7 could be asserted in this example. For wider data busses, a greater number of test columns can be supported. The test column is written in response to manufacturing processes, such as testing, based upon the look-up table set up for the particular manufacturing run.

FIG. 8 illustrates the test column read timing for the alternative approach using a command code rather than high voltage on an address pin. The reference numbers in FIG. 8 are the same as those in FIG. 6 where appropriate. In this mode, the process proceeds as discussed above with respect to FIG. 7. There is no high voltage on address pin A6. Also, the address bit A0 selects the left or right column.

In order to enter the read mode, a command code is asserted on the data lines Q0–Q7 as indicated at 188. For example, a command code 66 hex could be utilized. At point 191, after assertion of the active low output enable signal at point 192, the data lines Q0–Q7 provide output data at point 191. In the test column read mode, only one bit may be provided for a single test column. For example, Q7 could be utilized for the output data in the test column read mode. This single bit is read in a sequential fashion, based upon the addresses provided by the look-up table, to determine the stored chip data. For greater numbers of test columns, the output data can be expanded to include more input/output pins.

Thus, an automatic non-volatile result write circuit with associated test mode circuitry in a non-volatile memory device is illustrated for use in integrated circuit manufacturing. The device has both engineering and production modes and allows storing status information indicating the success of an endurance cycling, or the number of tests passed by a particular chip during endurance cycling.

According to the present invention a wide variety of data is stored in a test column, as specified for a particular manufacturing run with a look-up table in the test processor, or elsewhere in the automated fabrication process equipment. For example, wafer level acceptance test WAT information could be used. For example, critical dimensions (CDs), typical N-MOS and P-MOS threshold voltages, breakdown voltages, well resistance values, etc. could be stored in the test column with a well defined look-up table. Also, a variety of information about metal mask options, the process and test machines which were engaged during manufacture of the product, work stream or process flow information, and test program versions could be stored in the test column with a well defined look-up table. It will be appreciated that all kinds of information can be efficiently stored in a test column with minimal penalty in terms of cost or space on the integrated circuit requiring such information. Furthermore, the information specified can by changed easily from run to run, without requiring modifications of the chip under manufacture.

Using the non-volatile test result write circuitry according to the present invention, testing can be executed much more efficiently during the manufacture of integrated circuits. Also, the information available from such testing is improved. Overall, the quality and the cost of the integrated circuits manufactured using this technique is improved.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method of manufacturing a plurality of integrated circuit devices including memory, the memory including an array of memory cells having characteristics determined by results of a test, the array including a plurality of rows and a plurality of columns selected by addresses; comprising:

providing a test column of memory cells in the devices, said memory cells in the test column being selected by a portion of the addresses which identifies a row in the array;

executing the test for a particular device in the plurality of integrated circuit devices to determine the characteristic for the particular device, mapping the results of the test to a given row in the array associated with the test to produce a characteristic code address for the particular device, enabling access to the test column for the particular device, and writing, in response to the characteristic code address, a bit in a memory cell in the test column in the given row of the particular device; and reading the test column in the particular device to classify the particular device according to the characteristic.

2. The method of claim 1, including during the step of enabling access to the test column, disabling access to the array.

3. The method of claim 1, wherein the array of memory cells includes wordlines extending along the rows in the array and bit lines extending along the plurality of columns in the array, and the step of providing a test column includes providing an extra bit line coupled to the test column of memory cells in the array, and coupling the wordlines in the memory array to the memory cells in the test column.

4. The method of claim 3, wherein the plurality of integrated circuit devices include address inputs and data inputs which receive addresses and data for accessing the array, and the step of enabling access to the test column includes applying a command code to at least one of an address input and a data input on the particular device, and in response to the command code connecting the extra bit line to circuitry for access to memory cells in the test column.

5. The method of claim 3, wherein the memory cells in the test column include non-volatile memory cells.

6. The method of claim 5, wherein the non-volatile memory cells include floating gate transistors.

7. The method of claim 1, wherein the memory cells in the test column include a set of N memory cells coupled to N corresponding rows in the plurality of rows, and data specifying the results of the test includes M bits of data, and M is greater than N.

8. The method of claim 7, wherein the step of mapping includes providing a table mapping at least N versions of the M bits of data to the N corresponding rows in plurality of rows corresponding to the set of N memory cells.

9. A method of manufacturing a plurality of integrated circuit devices including memory, the memory including an array of memory cells having characteristics determined by results of a suite of tests, the array including a plurality of rows and a plurality of columns selected by addresses; comprising:

providing a test column of non-volatile memory cells in the plurality of integrated circuit devices, said memory cells in the test column being selected by a portion of the addresses which identifies a row in the plurality of rows, wherein the test column includes a plurality of sets of memory cells corresponding to tests in the suite of tests, the sets including a first set corresponding to a first test in the suite and a second set corresponding to a second test in the suite;

executing the suite of tests to determine the characteristics for a particular device in the plurality of integrated circuit devices, and produce data specifying the results of the suite of tests, mapping the results of the first test in the suite of tests to the portion of the addresses which identifies a first given row of a memory cell in the first set to produce characteristic code addresses for results of the first test, mapping the results of the second test in the suite of tests to the portion of the addresses which identifies a second given row of a memory cell in the second set to produce characteristic code addresses for results of the second test, enabling access to the test column for the particular device, and writing, in response to the characteristic code addresses, bits in memory cells in the test column in the first and second given rows of the particular device; and reading the test column in the plurality of devices to classify the particular device according to the characteristics.

10. The method of claim 9, including during the step of enabling access to the test column, disabling access to the array.

11. The method of claim 9, wherein the array of memory cells includes wordlines extending along the plurality of rows in the array and bit lines extending along the plurality of columns in the array, and the step of providing a test column includes providing an extra bit line coupled to the test column of memory cells in the array, and coupling the wordlines in the memory array to the memory cells in the test column.

12. The method of claim 11, wherein the devices include address inputs and data inputs which receive addresses and data for accessing the array, and the step of enabling access to the test column includes applying a command code to at least one of an address input and a data input on the particular device, and in response to the command code connecting the extra bit line to circuitry for access to said memory cells in the test column.

13. The method of claim 9, wherein the non-volatile memory cells include floating gate transistors.

14. The method of claim 9, wherein the first set in the test column includes N memory cells coupled to N corresponding rows in the plurality of rows, and data specifying the results of the first test includes M bits of data, and M is greater than N.

15. The method of claim 14, wherein the step of mapping includes providing a table mapping at least N versions of the M bits of data to the N corresponding rows in the plurality of rows corresponding to the first set.

16. A method of manufacturing a plurality of integrated circuit devices including memory, the memory including an array of floating gate memory cells having characteristics determined by results of a test, the array including a plurality of rows and a plurality of columns selected by addresses and wordlines extending along respective rows in the plurality of rows and bit lines extending along respective columns in the plurality of columns, comprising:

providing a test column of floating gate memory cells in a particular device in the plurality of devices, said memory cells in the test column being selected by a portion of the addresses which identifies a corresponding row in the plurality of rows, including providing an extra bit line coupled to the test column of memory cells, and coupling the wordlines in the memory array to the memory cells in the test column;

executing the test to determine the characteristic for the particular device, mapping the results of the test to the portion of the addresses which identifies the corresponding row in the array to produce a characteristic code address for the particular device, enabling access to the test column for the particular device, and writing, in response to the characteristic code address, a bit in a memory cell in the test column in the corresponding row of the particular device; and reading the test column in the particular device to classify the particular device according to the characteristic.

17. The method of claim 16, including during the step of enabling access to the test column, disabling access to the array.

18. The method of claim 16, wherein the devices include address inputs and data inputs which receive addresses and data for accessing the array, and the step of enabling access to the test column includes applying a command code to at least one of an address input and a data input on the particular device, and in response to the command code connecting the extra bit line to circuitry for access to memory cells in the test column.

19. The method of claim 16, wherein the test column includes a set of N memory cells coupled with N corresponding rows in the plurality of rows, and data specifying the results of the test includes M bits of data, and M is greater than N.

20. The method of claim 19, wherein the step of mapping includes providing a table mapping at least N versions of the M bits of data to the N corresponding rows in the array.

* * * * *